United States Patent [19]
Kotani

[11] Patent Number: 5,361,233
[45] Date of Patent: Nov. 1, 1994

[54] SEMICONDUCTOR MEMORY APPARATUS

[75] Inventor: Hisakazu Kotani, Takarazuka, Japan

[73] Assignee: Matsushita Electric Industrial Co., Ltd., Osaka, Japan

[21] Appl. No.: 104,936

[22] Filed: Aug. 12, 1993

Related U.S. Application Data

[63] Continuation of Ser. No. 704,971, May 23, 1991, abandoned.

[30] Foreign Application Priority Data

May 25, 1990 [JP] Japan .................... 2-136039

[51] Int. Cl.$^5$ .............................................. G11C 7/02
[52] U.S. Cl. .................... 365/207; 365/190; 365/208; 365/189.02
[58] Field of Search .......... 365/190, 207, 208, 189.01, 365/189.02, 210, 214, 231, 196

[56] References Cited

U.S. PATENT DOCUMENTS

| | | | |
|---|---|---|---|
| 4,777,625 | 10/1988 | Sakui et al. | 365/189 |
| 4,891,792 | 1/1990 | Hanamura et al. | 365/190 |
| 5,063,540 | 11/1991 | Takahashi | 365/190 |

OTHER PUBLICATIONS

"Micro Electronic Circuits" Adel S. Sedra, K. Smith p. 749; 1982.
"Circuit Technologies for 16Mb DRAMs", T. Mano et al., ISSCC87 Digest of Technical Papers, p. 22 (Feb. 1987).

*Primary Examiner*—Robert J. Pascal
*Assistant Examiner*—Reginald A. Ratliff
*Attorney, Agent, or Firm*—Wenderoth, Lind & Ponack

[57] ABSTRACT

A semiconductor memory device is for randomly reading and writing data. Only a second bit line pair selected by a string selecting signal is amplified by a main amplifier. The number of the upper bit line pairs to be charged and discharged from the Vcc level or Vss level is reduced to thereby reduce the consumption current of the device.

21 Claims, 13 Drawing Sheets

SEMICONDUCTOR MEMORY APPARATUS

This application is a continuation of now abandoned application, Ser. No. 07/704,971, filed May 23, 1991.

BACKGROUND OF THE INVENTION

The present invention generally relates to a semiconductor memory apparatus for and writing data at random.

Semiconductor memory device for reading and writing data at random, especially dynamic random access memories (DRAMs), have been widely used in the recent years due to their mass memory capacity and lower cost, and it is expected that the memory capacity and performance capabilities of such devices will increase year by year.

A multiplexing bit line system is proposed as one technique of achieving higher performance (higher speed) of the DRAM (T. Mano et al., "Circuit Technologies for 16 Mb DRAMs" ISSCC87 Digest of technical papers, P22 (February, 1987)).

FIGS. 9 and 10 show the construction of the conventional multiplexing bit line system. In FIG. 9, reference numeral 101 denotes unit memory cells each constructed of one transistor TR and one capacitor CS being provided as shown in FIG. 10. In FIG. 9, reference numeral 102 denotes word lines for selecting a row of the memory cell 101 and being connected to the gate of each transistor TR as shown in FIG. 10. In FIG. 9, reference numeral 103 denotes bit lines for reading and writing data directly from and to each memory cell 101, and is connected with the drain of each transistor TR as shown in FIG. 10.

As shown in FIG. 9, a sense amplifier SA for amplifying the micropotential on the bit line 103 is connected with a pair of bit lines 103. Each upper bit line 106 is connected through a switch element 104 which controls according to a signal line 105 the selection of a block including the memory cells 101 connected with the end portion of each bit line 103. In the following, the bit line 106 is referred to as an upper bit line 106 and the bit line 103 is referred to as a lower bit line 103.

A main amplifier MA is connected with a pair of upper bit lines 106 so as to amplify the micropotential on the upper bit line 106. A common data line pair 108 is connected with the end portion of each upper bit line 106 through a switch element 107 to be controlled by a string decoder YS for selecting the string direction of the memory cell 101. In this case, a pair of common data lines 108 is connected with respect to a plurality of pairs of upper bit lines 106.

FIG. 11 shows a basic construction of a data line orthogonal system DRAM which is different from the conventional multiplexing bit line system described hereinabove. In FIG. 11, reference numeral 201 denotes unit memory cells, reference numeral 202 denotes word lines for selecting the row direction of the memory cell 201 and reference numeral 203 denotes bit lines for reading and writing data directly from and to each memory cell 201, with no distinction being provided between the upper and the lower in the bit line 203.

A sense amplifier SA is connected with a pair of bit lines 203 so as to amplify the micropotential on the bit lines 203, and also, a switch element 204 to be controlled by a string decoder YS for selecting the string direction of the memory cell 201 is connected with the end portion of each bit line 203. Also, a pair of common data lines 208 is connected with respect to a plurality of pairs of bit lines 203.

The multiplexing bit line system has an advantage of a having higher speed property as compared with the data line orthogonal system. This is due to the difference in the floating capacity of the data line of the rear stage of the sense amplifier SA.

The timing of connecting a bit line to be connected with a memory cell with a data line of the rear stage of the sense amplifier SA is faster if the capacity of the data line of the rear stage of the sense amplifier SA is smaller. As the floating capacity in the data line of the rear stage of the sense amplifier SA is smaller, the higher speed may be effected. The data line of the rear stage of the sense amplifier SA is an upper bit line 106 in the multiplexing bit line system, and is a common data line pair 208 in the data line orthogonal system. The capacity component of the upper bit line 106 is mainly a wiring capacity, while the capacity component of the common data line pair 208 is a wiring capacity and a diffusion capacity of the drain region of the switch element 204. As the common data line pair 208 is normally two to three times as large as in floating capacity, the multiplexing bit line system has the higher speed performance.

But in the construction of such a multiplexing bit line system as described hereinabove, the upper bit lines of 2048 through 4096 are operated at the same time in the 16M bit class. Namely, the electric charge is charged to and discharged from the power voltage level or the ground level with the respect to several thousands of lines of wiring capacity.

In the data line orthogonal system, four through sixteen lines of common data line pairs are operated also in the 16M bit class so as to charge or discharge the electric charge.

It is clearly found in both systems that the multiplexing bit line system is larger as compared with the size of capacity to be charged to and discharged from at the same time. This means that the multiplexing bit line system has a disadvantageously larger consumption current.

SUMMARY OF THE INVENTION

Accordingly, the present invention has been developed with a view to substantially eliminating the above discussed drawbacks inherent in the prior art, and has for its essential object to provide an improved semiconductor memory apparatus.

Another important object of the present invention is to provide an improved semiconductor memory apparatus of the type referred to above, which has a smaller consumption current as compared with the conventional devices without damaging the high speed property of the multiplexing bit line system.

In accomplishing these and other objects, according to one preferred embodiment of the present invention a first bit line is connected directly with the memory cell and adapted to read and write data, a sense amplifier to be connected with a pair of first bit lines, a second bit line pair is connected through first switch elements which are equal in number to the first bit lines with the end portion of a pair or a plurality of pairs of first bit lines, a common data line pair is connected through a second switch element to be controlled by a string selecting signal with the end portions of a plurality of pairs and of second bit line pairs, a main amplifier is connected with the end portion of the common data line pair.

According to a second embodiment of the present invention, a first bit line is connected directly with a memory cell and adapted to read and write the data, a sense amplifier is connected with a pair of first bit lines, a second bit line pair is connected through first switch elements which are equal in number to the first bit lines with the end portions of a pair or a plurality of pairs of first bit lines, a main amplifier is connected with a pair of second bit lines and adapted to be controlled by a string selecting signal, and a common data line pair is connected through second switch elements to be controlled with a string selecting signal with the end portions of a plurality of pairs of second bit line pairs.

According to a third embodiment of the present invention, a first bit line is connected directly with a memory cell and adapted to read and write data, a sense amplifier is connected with a pair of first bit lines, a second bit line pair is connected, through first switch elements which are equal in number to the first bit lines to be controlled by a logical element with a signal for selecting the block having the memory cell and a string selecting signal being inputted into it, with the end portions of a pair or a plurality of pairs of first bit lines, a main amplifier is connected with a pair of second bit lines, and a common data line is connected, through a second switch element to be controlled by the above described string selecting signal with the end portions of a plurality of pairs of second bit line pairs.

According to a fourth embodiment of the present invention, a first bit line is connected directly with a memory cell and adapted to read and write data, a sense amplifier is connected with a pair of first bit lines, second bit line pairs is connected through the first switch elements which are equal in number to the first bit lines to be controlled with a signal for selecting the block having the memory cell, and through the second switch elements connected in series with the first switch elements and controlled with the string selecting signal, with the end portions of a pair or a plurality of pairs of first bit lines, a main amplifier is connected with a pair of second bit lines, and a common data line pair is connected through the third switch elements to be controlled with the above described string selecting signal with the end portions of a plurality of pairs of second bit line pairs.

By the construction of the first embodiment the main amplifier is connected with the end portions of the second bit line pair and is provided in the rear stage of the second switch elements to be controlled with the string selecting signal, so that the number of the second bit lines to be operated at the same time, namely, the number of the bit lines to be charged to and discharged from the power voltage level or the ground level at the same time.

By the construction of the second embodiment only the main amplifier to be selected simultaneously with the second switch element by the string selecting signal operates, the selected second bit line pair only is amplified, so that the number of the second bit lines to be operated at the same time in the same manner as described hereinabove is decreased.

By the construction of the third embodiment the signals of the first bit line pair are transferred to the second bit line pair only to be selected simultaneously with the second switch elements with the string selecting signal, only the selected second bit line pair is amplified by the main amplifier, so that the number of the second bit lines to be operated at the same time is reduced in the same manner as described hereinabove.

By the construction of the fourth embodiment the signals of the first bit line pair are transferred to only the second bit line pair to be selected at the same time with the third switch elements with the string selecting signal, and the selected second bit line pair only is amplified by the main amplifier, the number of the second bit lines to be operated at the same time in the same manner is reduced.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Figure 1:
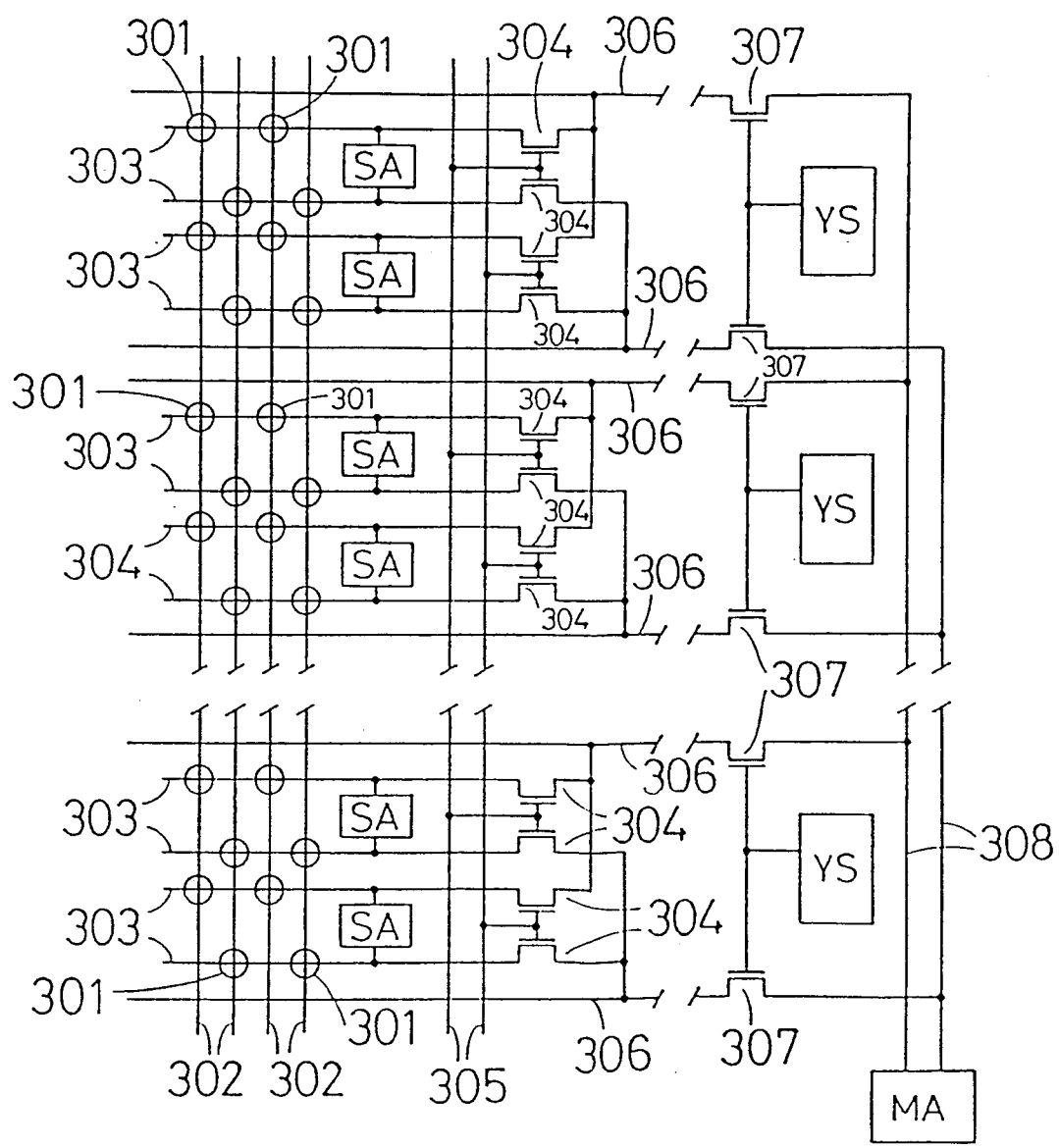
FIG. 1 is a block diagram of a semiconductor memory apparatus in accordance with a first embodiment of the present invention.

Before the description of the present invention proceeds, it is to be noted that like parts are designated by like reference numerals throughout the accompanying drawings.

Figure 10:
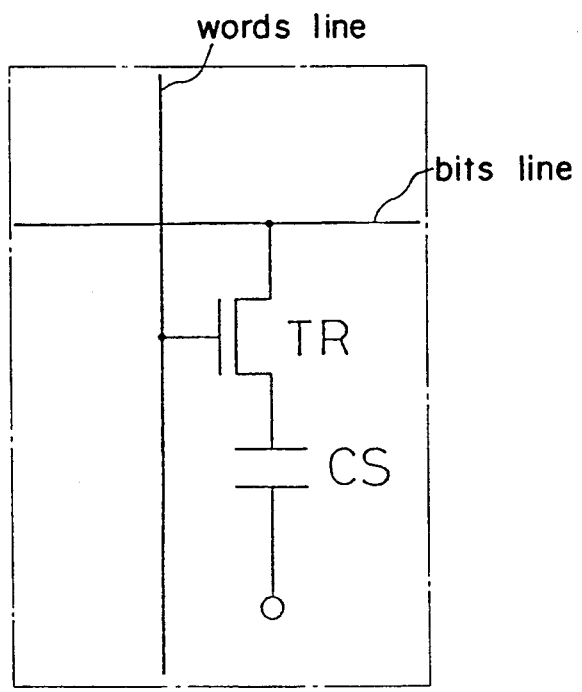
FIG. 10 is an equivalent circuit diagram of a unit memory cell.
Figure 11:
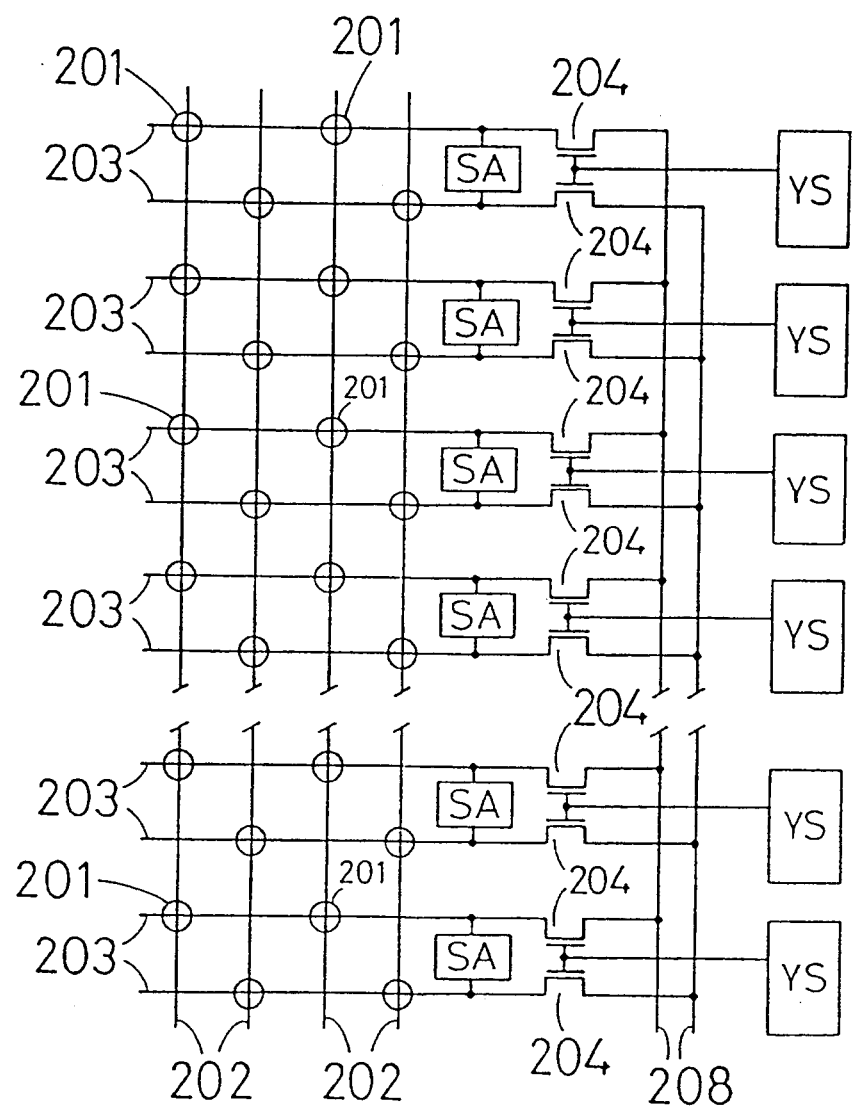
FIG. 11 is a block diagram of a semiconductor memory apparatus of a data line orthogonal system.

Referring now to the drawings, there is shown in FIG. 1 a semiconductor memory apparatus in accordance with a first embodiment of the present invention which includes unit memory cells 301, and work lines 302 for selecting a row of memory cells 301, with each word line 302 being connected to a gate of each transistor TR of each memory cell 301 as shown in FIG. 10.

In FIG. 1, reference numeral 303 is a bit line for reading and writing data directly from and to the memory cells 301, which is connected with the drain of each transistor TR as shown in FIG. 10. A sense amplifier SA is connected with a pair of bit lines 303 so as to amplify the micropotential on the bit lines 303.

Figure 1A:
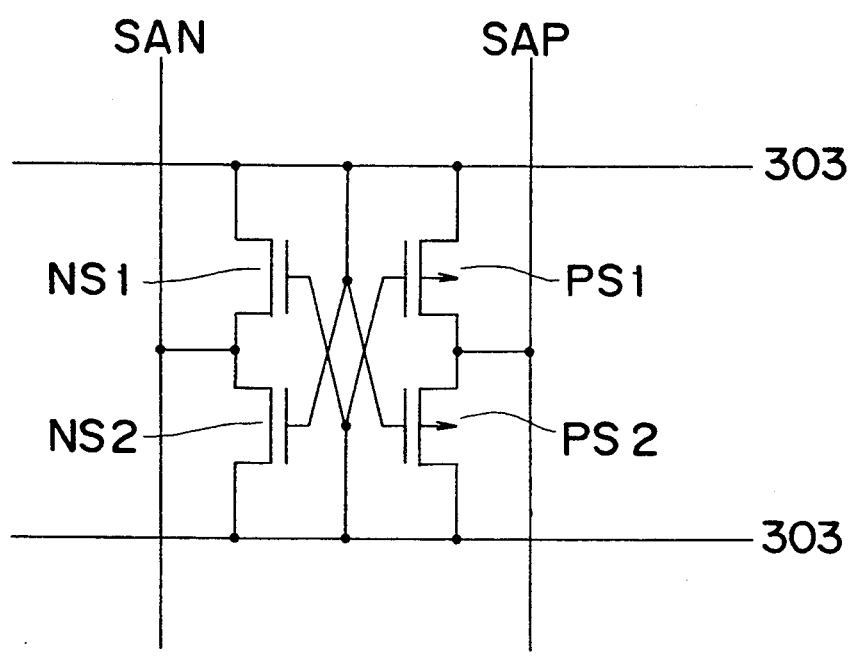
FIG. 1A is a circuit diagram of a sense amplifier SA.

The sense amplifier SA is composed of N type MOS transistors NS1, NS2 and P type MOS transistors PS1, PS2 as shown in, for example, FIG. 1A. The gate signals of NS1, NS2, PS1, PS2 respectively have only to apply the differential amplifier, connected in shirt sleeves of a X shape with the bit line pair 303 connecting to the above described memory cell. The common node SAN of the N type MOS transistors NS1, NS2 are connected with the earth conductor, the common node SAP of the P type MOS transistors PS1, PS2 are connected with the earth conductor. One end of the first switch element 304 is connected with the end portion of each bit line 303, and the first switch element 304 is controlled by the signal line 305 for selecting a block including the memory cell 301.

An upper bit line 306 is connected with the other end of the first switch element 304, one end of the second switch element 307 is connected with the end portion of the upper bit line 306, and the second switch element 307 is controlled by a string decoder YS for selecting the string direction of the memory cell 301. A common data line pair 308 is connected with the other end of the second switch element 307. In this case, a pair of common data line pairs 308 are connected with respect to a plurality of pairs of upper bit line pairs 306, with the main amplifier MA being connected with the other ends of the common data line pairs 308.

The main amplifier has only to apply such a differential amplifier as shown in, for example, FIG. 1A.

Figure 2:
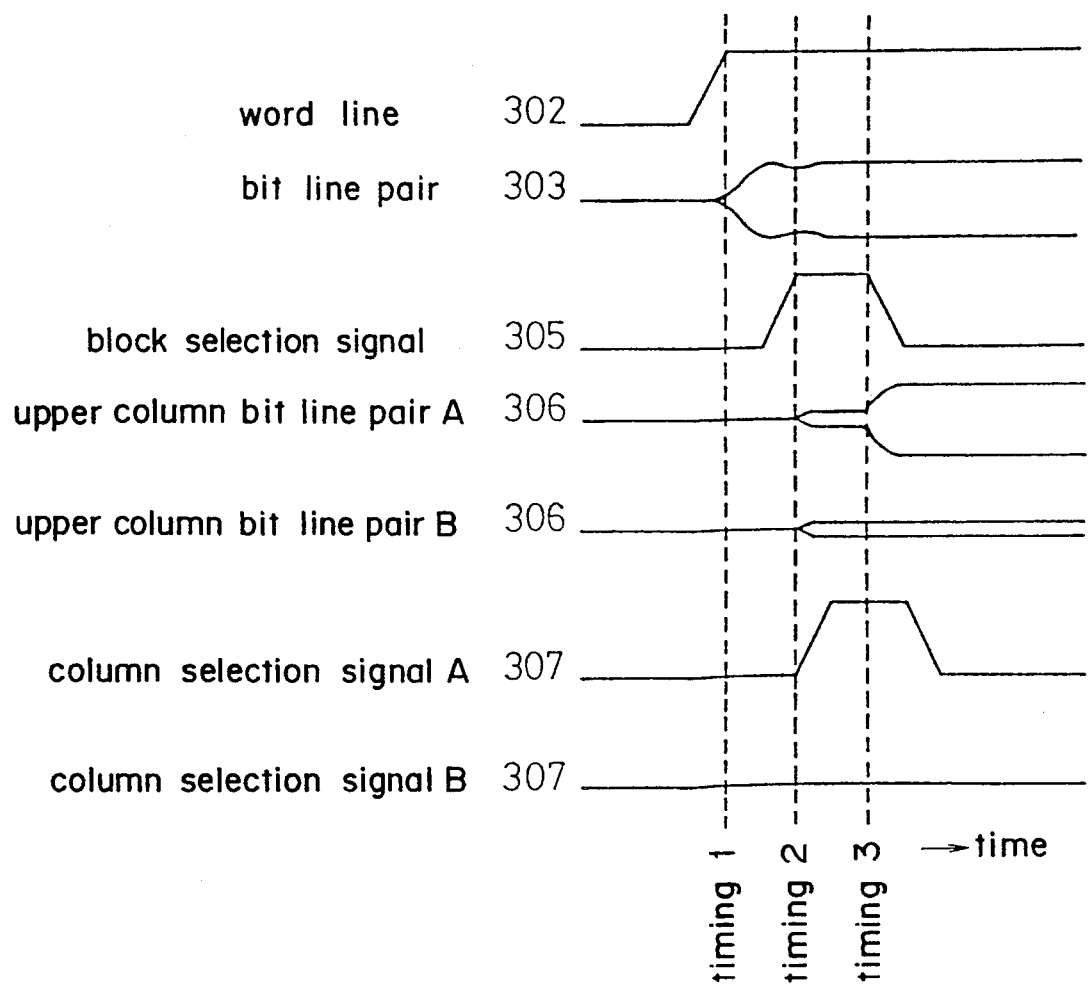
FIG. 2 is a wave-form chart showing the operation in the first embodiment.

The operation of the semiconductor memory apparatus in a first embodiment will be described hereinafter with reference to FIG. 2.

A word line 302 rises. The micropotential appears in the bit line pair 303 from the memory cell 301. The sense amplifier SA is operated at the time of timing 1 so as to amplify the potential of the bit line pair 303.

A block selecting signal 305 rises at the time of timing 2, and the potential of the bit line pair 303 is transferred to the upper bit line pair A306, B306. At this time, the column selecting signal line A307 (a gate signal of the second switch element 307 in FIG. 1) corresponding to the upper bit line pair A306 rises, while the column selecting signal line B307 corresponding to the upper bit line spring pair B306 remains as the low level.

The main amplifier MA operates at the time of the timing 3 so as to amplify the potential of the upper bit line pair A306 from the initial micropotential condition into the range from the power voltage Vcc level to the ground Vss level, with the upper bit line B306 remaining at the initial potential condition.

As described hereinabove, according to the first embodiment, the selected upper bit line pair 306 only is amplified because of the provision of the main amplifier MA in the rear stage of the second switch element 307, so that the number of the upper bit line pair to be charged into and discharged from the Vcc level or the Vss level through the comparison with the conventional multiplexing bit line system. Therefore, according to the first embodiment, an effect that the consumption current is reduced more than before may be obtained.

The concrete effects will be described hereinafter. By way of example of 16M bit DRAM, the number of a the lower bit lines is 4096 (word line number is 8192) according to the standard cell array construction although it is different in the memory cell array construction. If the multiplexing bit line system of the present invention is applied to the array construction, the number Nub of the upper bit lines becomes 2048. In the construction of the upper bit line with the use of the metallic wiring of the second layer, the parasitic capacity Cub per one, although it depends upon the device construction, the chip size, becomes approximately 2 pF in accordance with the virtual array construction. The power voltage and the operating frequency (cycle time) decide the consumption current. According to the multiplexing bit line system of the conventional system, all the upper bit lines are converted in potential into the power voltage level from the precharge level for each one cycle. Assume that the power voltage is 3.3 V, the precharge level is 1.64 V, and the potential variation $\Delta V$ is 1.65 V. As the upper bit line also operates in the differential form, the number of the upper bit lines to be operated in the same potential direction (power voltage or the earth voltage) at the same time is 1024. Assume that the cycle time T is 150 ns, and the average current I to be consumed in the upper bit line is calculated by the following formula.

$$I = (Cub * I. * N_{SVB}$$

Therefore, if the above mentioned practical value is adapted into the above formula, it can be obtained the value of (I=22.5 mA), to thereby increase the operation current. However, since the number of the bit lines in upper columns to be operated at the same time becomes increasing according to the present invention, it may be easily obtained the value of (Nvg=4−16), depending upon the circuit construction. Accordingly, the current to be consumed in the bit lines of upper columns is set up the value of (I=0.088 mA−0.35 mA), whereby it can be easily established the conditions to reduce greatly the current to be consumed in the bit lines of upper columns on the employment of the present invention.

Figure 3:
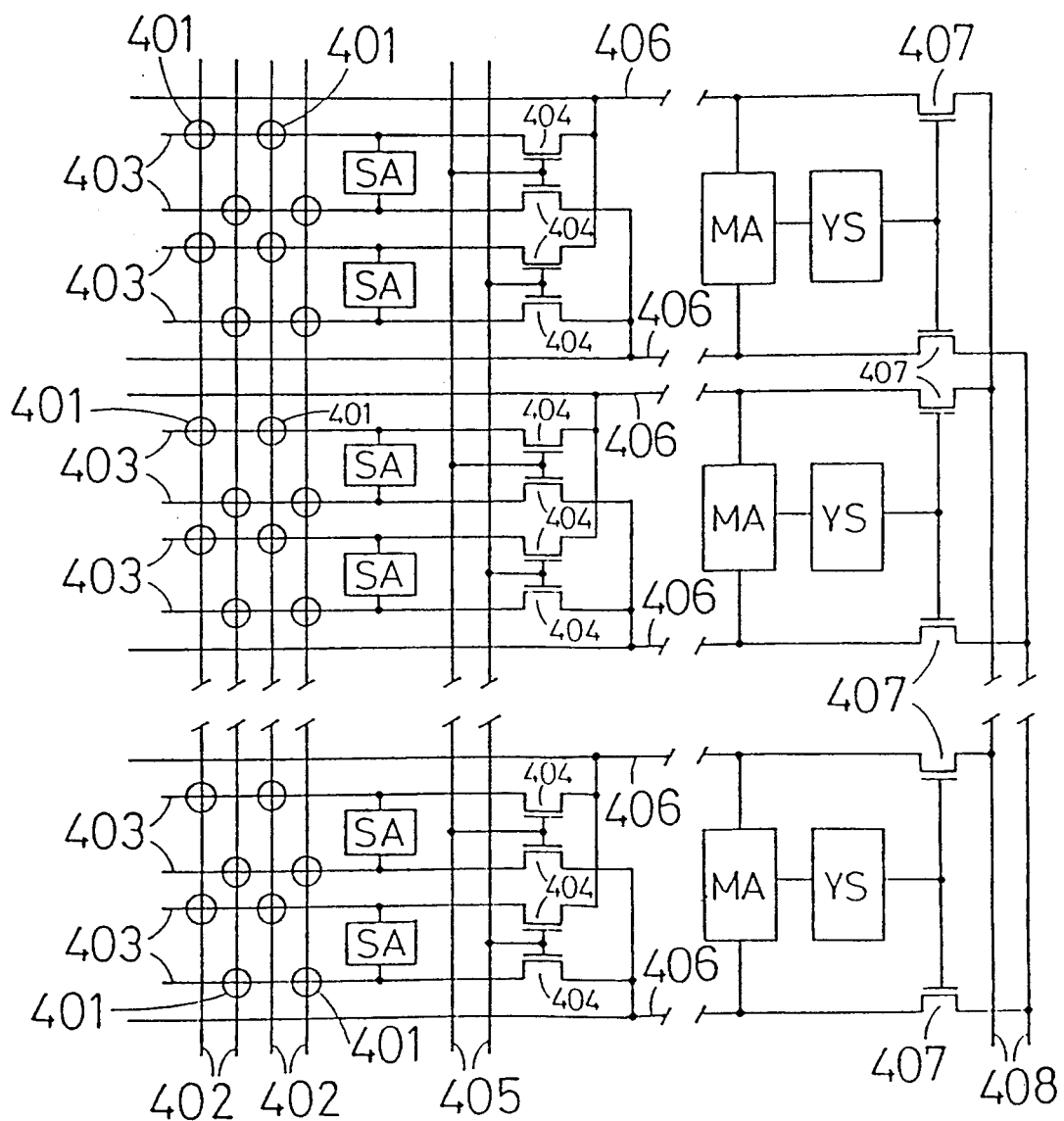
FIG. 3 is a block diagram of a semiconductor memory apparatus in a second embodiment of the present invention.

FIG. 3 shows a memory apparatus in accordance with a second embodiment of the present invention. Reference numeral 401 denotes unit memory cells, and reference numeral 402 denotes word lines for selecting a row the memory cells 401, with the word line 402 being connected to the gate of the transistor TR shown in FIG. 10. Furthermore, reference numeral 403 denotes bit lines for effecting the reading and writing of data directly from and to the memory cell, and is adapted to be connected with the drain of the transistor TR of FIG. 10. A sense amplifier SA is connected with a pair of bit lines 403 so as to amplify the micropotential on the bit lines 403.

Here, the sense amplifier has only to apply such a differential amplifier as shown in, for example, FIG. 1A. One end of the first switch element 404 is connected with the end portion of each bit line 403, and the first switch element 404 is controlled by the signal line 405 for selecting the block including the above described memory cell 401.

The upper bit line 406 is connected with the other end of the first switch element 404, the other end of the second switch element 407 is connected with the end portion of the upper bit line 406. The second switch element 406 is controlled by a string decoder YS for selecting the string direction of the memory cell 401. A common data line pair 408 is connected with the other end of the switch element 407. In this case, a pair of common data line pair is connected with a pair of pairs of upper bit lines 406. A main amplifier MA to be controlled by a string decoder YS for selecting the string direction of the memory cell is connected with the upper bit line pair 406.

Figure 3A:
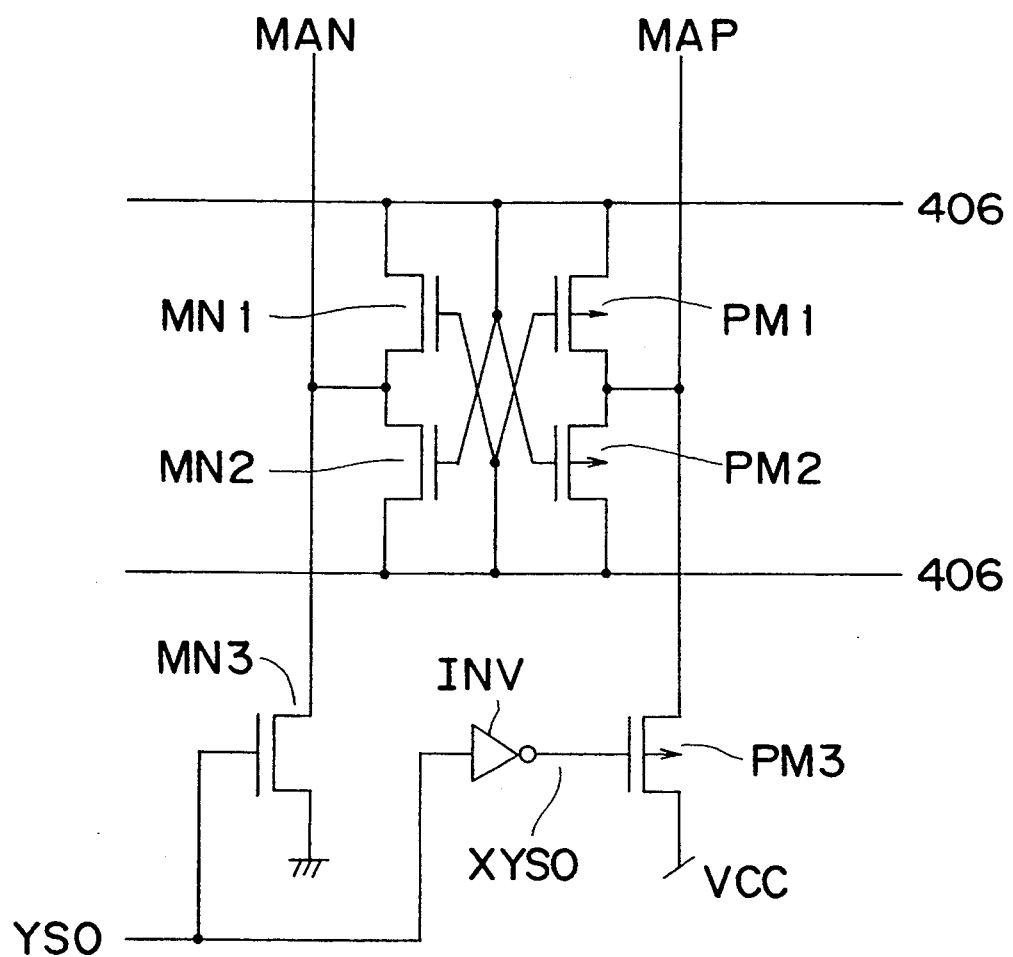
FIG. 3A is a circuit diagram of a main amplifier MA in accordance with a second embodiment.

Here the main amplifier is composed of N type MOS transistors NM1, NM2 and P type MOS transistors PM1, PM2 as shown in, for example, FIG. 3A. The gate signals of NM1, NM2, PM1, PM2 respectively have only to apply the differential amplifier connected in short sleeves of X shape with the above described upper bit line pair 406. The common node MAN of the N type MOS transistors NM1, NM2 is connected with the source earthed N type MOS transistor NM3, the gate signals are connected with the output signal YSO of the above described string decoder YS. The common node MAP of the P type MOS transistors PM1, PM2 is connected in the source with the P type MOS transistor PM3 connected with the power supply VCC, the gate signals are connected with the inversion signal XYSO (is produced by the inverter INV) of the above described string decode signal YSO so as to operate the main amplifier only when the above described string decoder YS has been activated. Only the upper bit line pair 406 connected with the second switch element 407 to be selected, from among a plurality of pairs of upper bit line pairs 406, are amplified.

Figure 4:
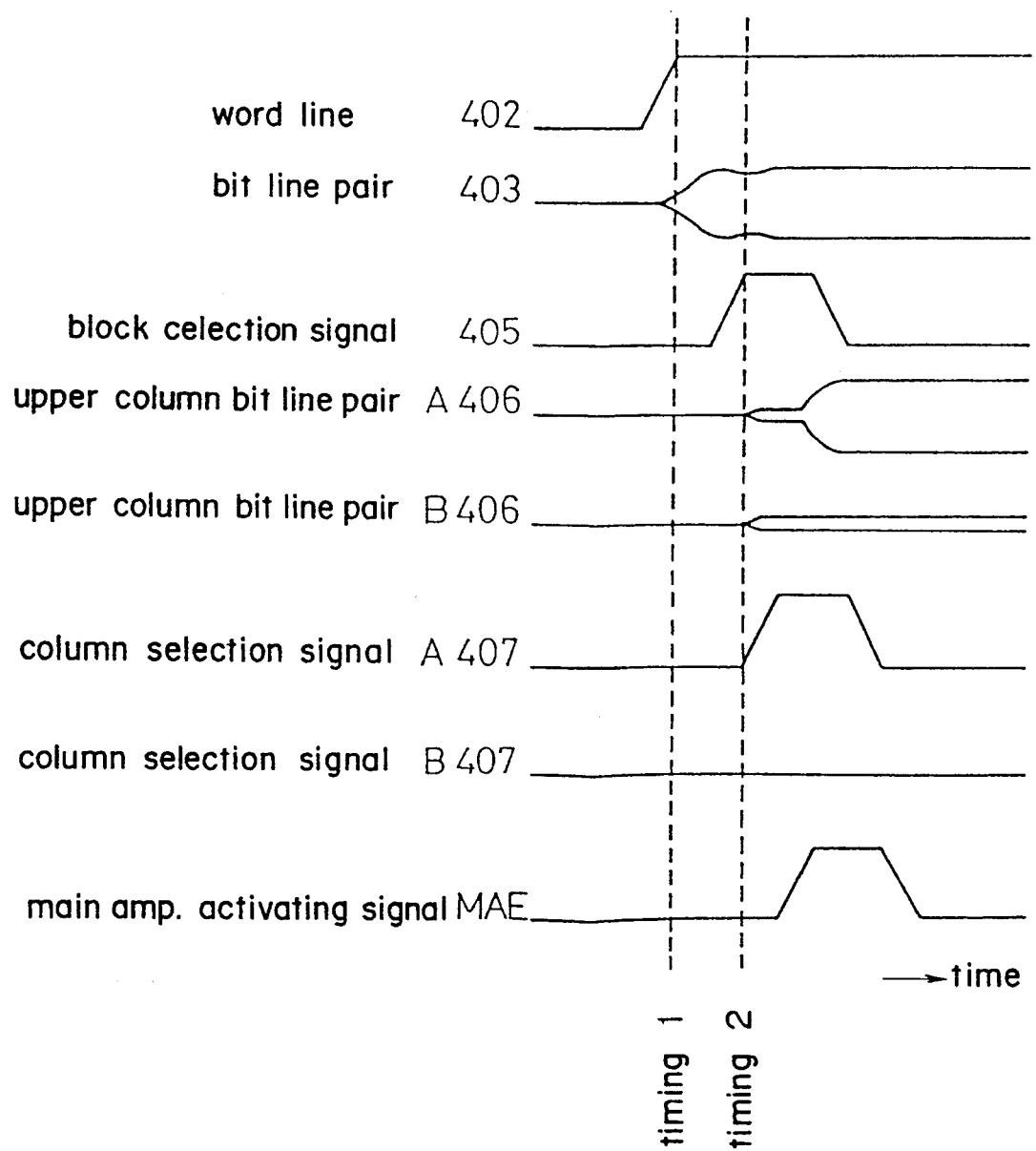
FIG. 4 is a wave-form chart showing the operation of a second embodiment.

The operation of the semiconductor memory apparatus in accordance with the second embodiment will be described hereinafter in accordance with FIG. 4.

The word line 402 rises. The micropotential appears on the bit line pair 403 from the memory cell 401. The sense amplifier SA operates at the time of the timing 1 so as to amplify the potential of the bit line pair 403.

A block selecting signal 405 rises at the time of the timing 2. The potential of the bit line pair 403 is transferred into the upper bit line pair A406, B406. At this time, the column selecting signal line A407 (the gate signal of the second switch element 407 in FIG. 3) corresponding to the upper bit line pair A406 rises with the column selecting signal line B407 corresponding to the upper bit line pair B406 remaining at a low level. At the same time, only the main amplifier activation signal MAE of the main amplifier MA connected with the upper bit line pair A406 rises by the column selecting signal line A407. The main amplifier MA connected with the upper bit line pair A406 starts its operation and the potential of the upper bit line pair A406 is amplified into the Vcc level or into Vss level, while the upper bit line pair B406 remains in the initial micropotential condition.

As described hereinabove, according to the second embodiment, only the main amplifier MA to be selected at the same time with the second switch element 407 by the string decoder YS operates so as to amplify the selected upper bit line pair 406 only, so that the number of the upper bit line pair to be charged to and discharged from the Vcc level or Vss level through comparison with the conventional multiplexing bit line system may be considerably reduced. Thus, according to the second embodiment, an effect that the consumption current is reduced more than before may be obtained.

Figure 5:
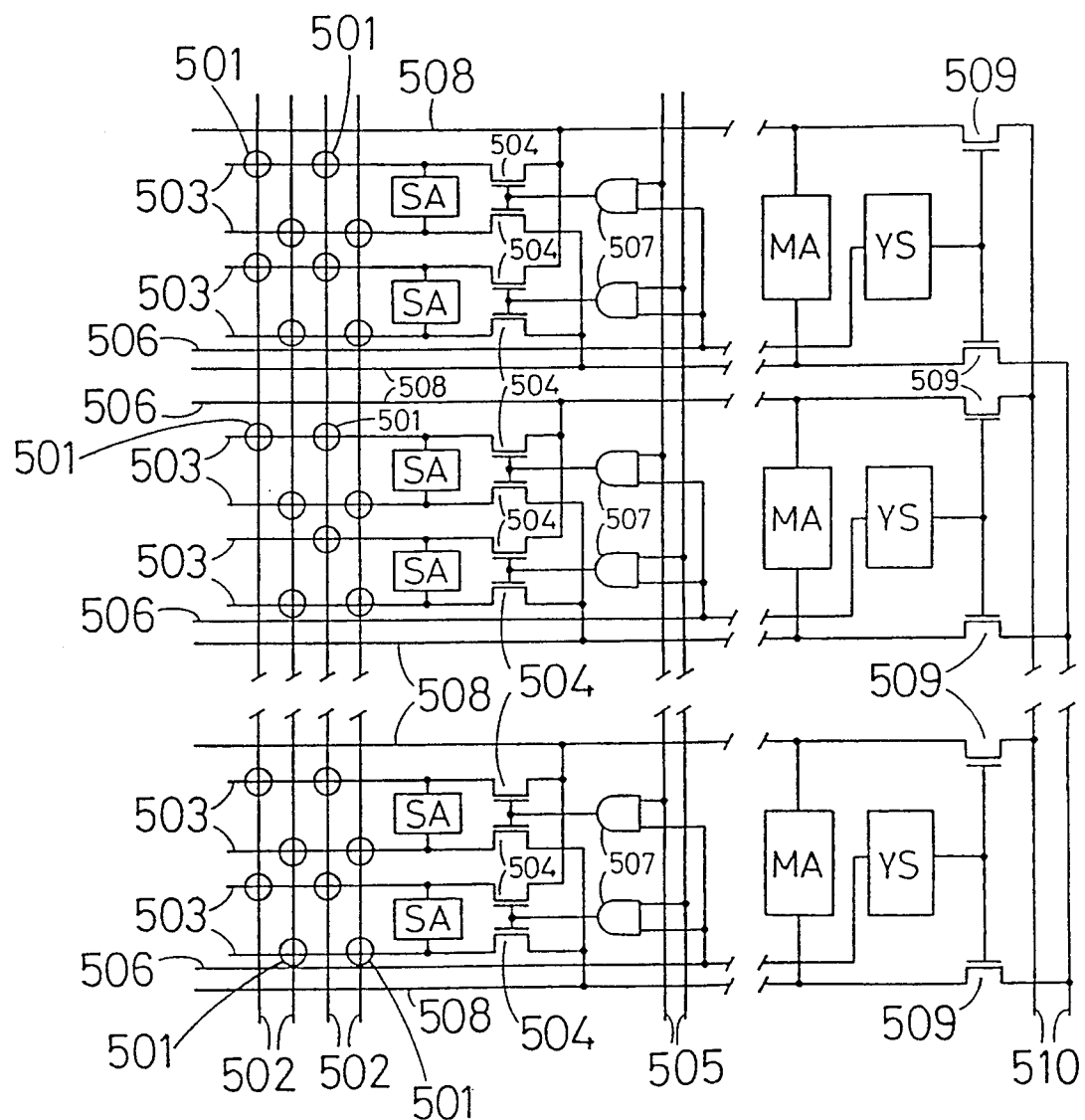
FIG. 5 is a block diagram of a semiconductor memory apparatus in accordance with a third embodiment of the present invention.

FIG. 5 shows a block diagram of a semiconductor memory apparatus in accordance with a third embodiment of the present invention. In the drawing, reference numeral 501 denotes unit memory cells, and reference numeral 502 denotes word lines for selecting the row direction of the memory cell 501, with the word line 502 being connected to the gate of the transistor TR shown in FIG. 10.

In FIG. 5, reference numeral 503 denotes bit lines for effecting the reading and writing of data directly from and to the memory cell 501, and is adapted to be connected with the drain of the transistor TR of FIG. 10. A sense amplifier SA is connected with a pair of bit lines 503 so as to amplify the micropotential on the bit lines 503.

Here, the sense amplifier has only to apply such a differential amplifier as described, for example in FIG. 1A. One end of the first switch element 504 is connected with the end portion of each bit line 503, and the first switch element 504 is controlled by the signal line 505 for selecting the block including the above described memory cell 501 and a logic element 507 (in FIG. 5, 2 input AND) to which the output signal 506 of the string decoder YS for selecting the string direction of the above described memory cell 501. The upper bit line 508 is connected with the other end of the first switch element 504, one end of the second switch element 509 is connected with the end portion of the upper bit line 508. The second switch element 509 is controlled by a string decoder YS for selecting the string direction of the memory cell 501. The main amplifiers MA are connected one by one with the respective upper bit line pairs 508, and the common data line pair 510 is connected with the other end of the switch element 509. In this case, a pair of common data line pairs 510 are connected with a plurality of pairs of upper bit lines 508.

Here the main amplifier MA has only to apply such a differential amplifier as shown in, for example, FIG. 1A.

Figure 6:
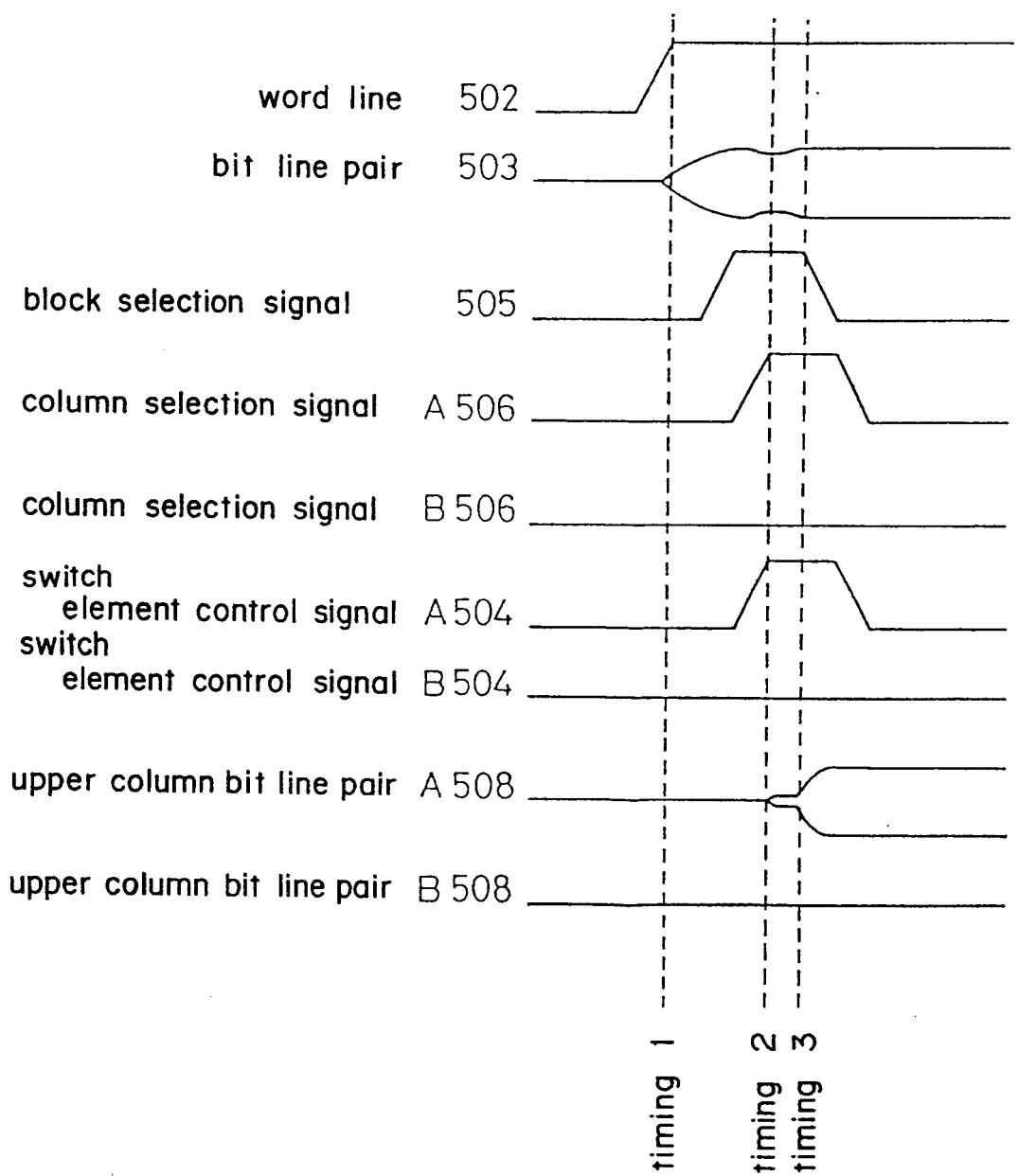
FIG. 6 is a wave-form chart showing the operation of a third embodiment.

The operation of the semiconductor memory apparatus in accordance with the third embodiment will be described in accordance with the FIG. 6.

The word line 502 rises. The micropotential appears in the bit line pair 503 from the memory cell 501. The sense amplifier SA operates at the time of the timing 1 and the potential of the bit line pair 503 is amplified. Then, the block selecting signal 505 rises. Further, the column selecting signal line A506 corresponding to the upper bit line pair A508 rises. In the reception of the results, the control signal of the first switch element A504 corresponding to the upper bit line pair A508 rises and the control signal of the switch element B504 corresponding to the upper bit line pair B508 remains at a low level.

The potential of the bit line pair 503 is transferred into the upper bit line pair A508 only as shown in the timing 2. At the time of the timing 3, the main amplifier MA is activated, and the potential of the upper bit line pair A508 is amplified into the Vcc level or the Vss level, while the potential difference does not appear in the upper bit line pair B508, thus resulting in the initial condition.

As described hereinabove, according to a third embodiment, as the signals of the lower bit line pair 503 are transferred into only the upper bit line pair 508 selected simultaneously with the second switch element 509 by the string decoder YS, only the selected upper bit line pair 508 is amplified by the main amplifier MA, so that the number of the upper bit line pairs to be charged to and discharged from the Vcc level or Vss level through the comparison with the conventional multiplexing bit line system may be considerably reduced. Thus, according to the third embodiment, an effect that the consumption current is reduced more than before may be obtained.

Figure 7:
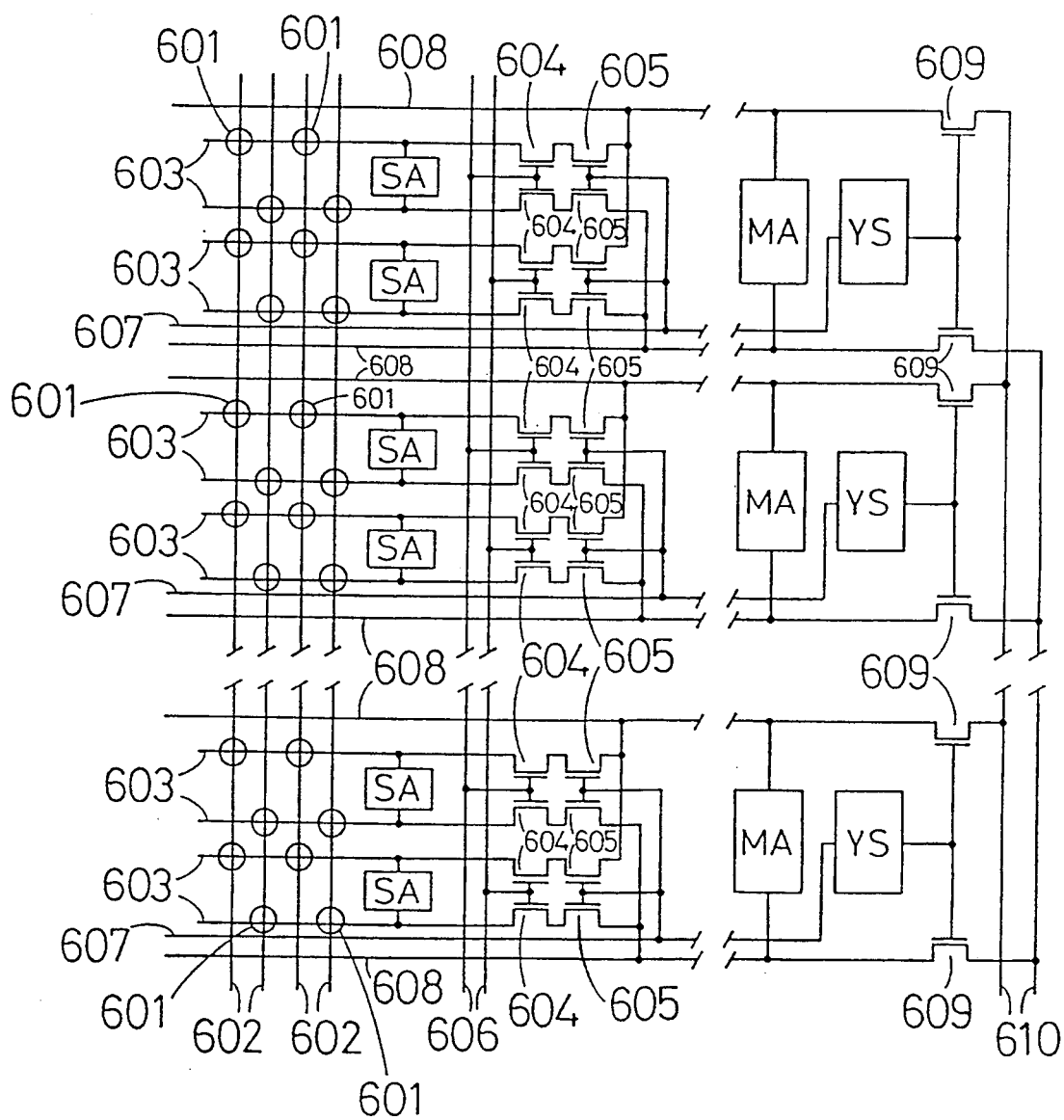
FIG. 7 is a block diagram of a semiconductor memory apparatus in accordance with a fourth embodiment of the present invention.

FIG. 7 shows a block diagram of a semiconductor memory apparatus in accordance with a fourth embodiment of the present invention. In the drawing, reference numeral 601 denotes unit memory cells and reference numeral 602 denotes word lines for selecting a row direction of the memory cells 601, with the word line 602 being connected to the gate of the transistor TR shown in FIG. 10.

In FIG. 7, reference numeral 603 denotes bit lines for effecting the reading and writing of data directly from and to the memory cell 601, and is adapted to be connected with the drain of the transistor TR of FIG. 10.

Here, the sense amplifier has only to apply such a differential amplifier as shown in, for example, in FIG. 1A. A sense amplifier SA is connected with a pair of bit lines 603 so as to amplify the micropotential on the bit lines 603. One end of the first switch element 604 is connected with the end portion of each bit line 603, and the first switch element 604 is controlled by the signal line 606 for selecting the block including the above described memory cell 601. One end of the second switch element 605 is connected in series with the first switch element 604 with the other end of the first switch element 604, and the second switch element 605 is controlled by the output signal 607 of the string decoder YS for selecting the string direction of the memory cell 601. The upper bit line 608 is connected with the other end of the second switch element 605, the one end of the third switch element 609 is connected with the end portion of the upper bit line 608. The third switch element 609 is controlled by a string decoder YS for selecting the string direction of the memory cell 601. The main amplifier MA is connected one by one with the respective upper bit line pair 608, and the common data line pair 610 is connected with the other end of the third switch element 609. In this case, a pair of common data line pairs 610 are connected with respect to a plurality of pairs of upper bit line pairs 608.

Here the main amplifier MA has only to apply such a differential amplifier as shown in, for example, in FIG. 1A.

Figure 8:
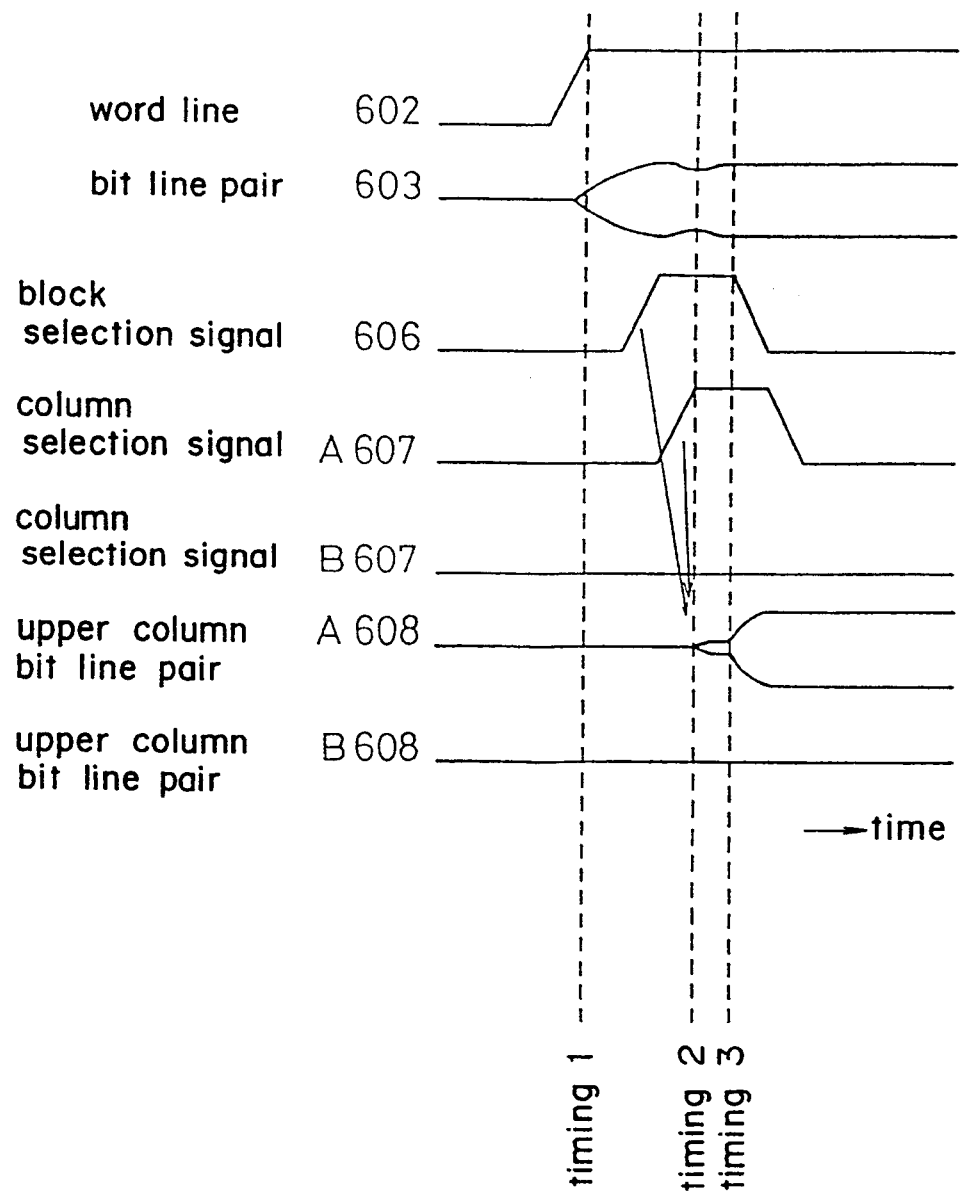
FIG. 8 is a wave-form chart showing the operation of a fourth embodiment.
Figure 9:
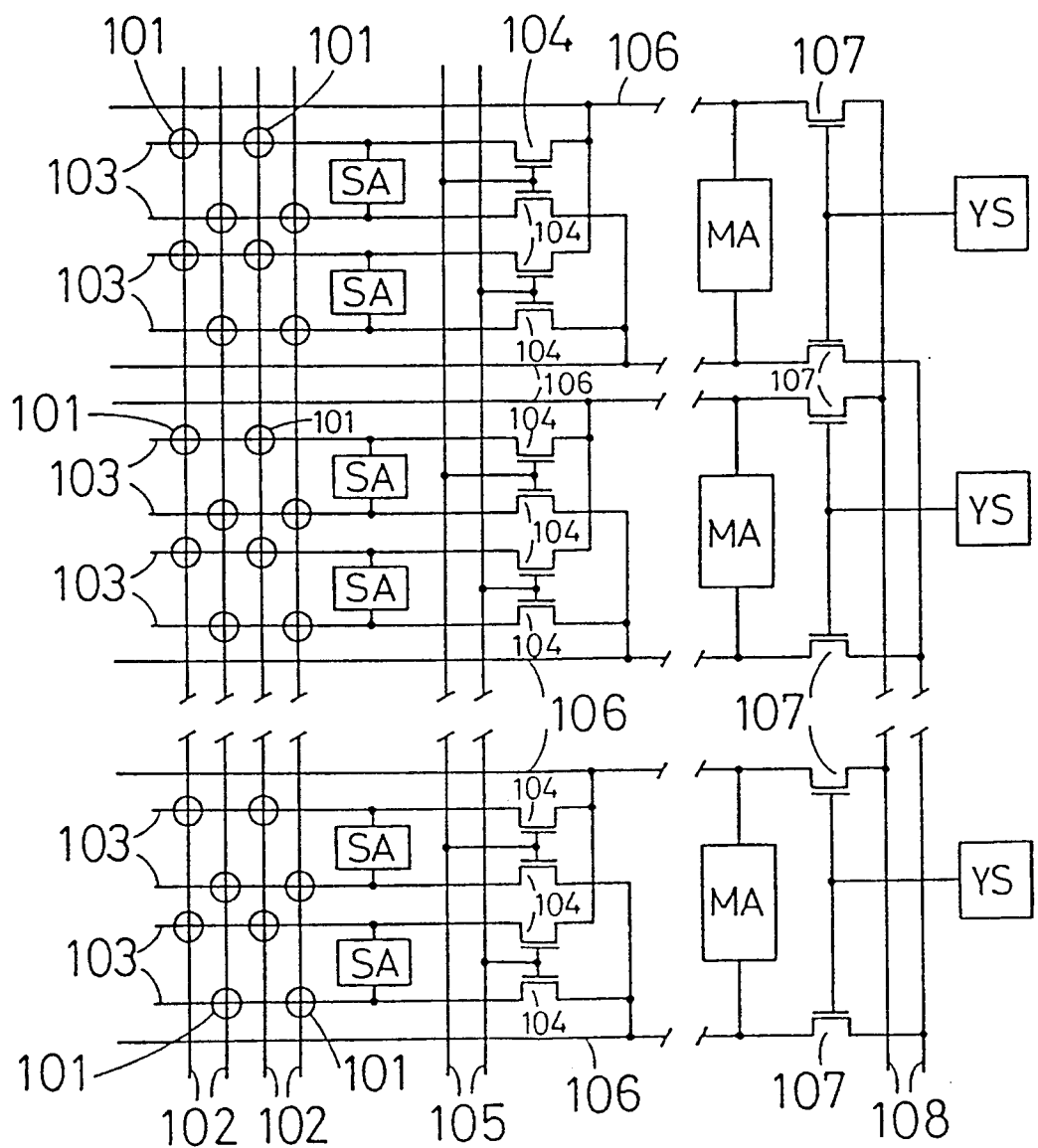
FIG. 9 is a block diagram of a semiconductor memory apparatus of the conventional multiplexing bit line system.

The operation of the semiconductor memory apparatus in accordance with a fourth embodiment will be described hereinafter with reference to FIG. 8.

The word line 602 rises. The micropotential appears in the bit line pair 603 from the memory cell 601. The sense amplifier SA operates at the time of the timing 1 and the potential of the bit line pair 603 is amplified. Then, the block selecting signal 606 rises. Further, the column selecting signal line A607 corresponding to the upper bit line pair A608 rises. In the reception of the results, the control signals of the first switch elements A604, A605 corresponding to the upper bit line pair A608 rise and the the bit line pair 603 and the upper bit line pair A608 become the same level electrically, while the control signals of the second switch element B604 corresponding to the upper bit line pair B608 remain low at level. Namely, as the bit line pair 603 and the upper bit line pair B608 become open electrically, the potential of the bit line pair 603 is transferred into the upper bit line pair A608 only as shown in the timing 2. At the time of the timing 3, the main amplifier MA is activated, and the potential of the upper bit line pair A608 is amplified into the Vcc level or the Vss level, while the potential difference does not appear in the upper bit line pair B608, thus resulting in the initial condition.

As described hereinabove, according to a fourth embodiment, the signals of the lower bit line pair 603 are transferred into only the upper bit line pair 608 selected simultaneously with the third switch element 609 by the string decoder YS. As only the selected upper bit line pair 608 is amplified by the main amplifier MA, the number of the upper bit line pairs to be charged to and discharged from the Vcc level or Vss level through the comparison with the conventional multiplexing bit line system may be considerably reduced. Thus, according to the fourth embodiment, an effect that the consumption current is reduced more than before may be obtained.

As is clear from the foregoing description, as only the second bit line pair only to be selected with the string selecting signal is amplified by the main amplifier, the number of the upper bit line pairs to be charged to and discharged from the Vcc level is reduced or Vss level as compared with the conventional multiplexing bit line system.

As the semiconductor memory apparatus may reduce the consumption current more than before, the practical use effect is extremely large.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A semiconductor memory apparatus comprising:
plural first bit lines each connected directly with memory cells and adapted to read and write data,
a sense amplifier connected with a pair of said first bit lines,
plural second bit line pairs connected through first switch elements, which are equal in number to the first bit lines, with end portions of a pair or a plurality of pairs of said first bit lines,
a common data line pair connected through second switch elements, which are controlled by a column selecting signal, with end portions of a plurality of the second bit line pairs, and
a main amplifier connected with end portions of the common data line pair, said common data line pair being electrically connected between said main amplifier and said second switch elements.

2. A semiconductor memory apparatus described in accordance with the claim 1, wherein each memory cell is composed of a switching transistor and a capacitor controlled by word lines.

3. A semiconductor memory apparatus described in accordance with the claim 1, wherein the sense amplifier is a differential amplifier composed of two N type MOS transistors having respective gates connected with the pair of first bit lines and two P type MOS transistors having respective gates connected with the pair of first bit lines.

4. A semiconductor memory apparatus described in accordance with the claim 1, wherein the sense amplifier is a differential amplifier composed of two N type MOS transistors having respective gates connected with the pair of first bit lines.

5. A semiconductor memory apparatus described in accordance with the claim 1, wherein the main amplifier is a differential amplifier composed of two N type MOS transistors having respective gates connected with the common data line pair and two P type MOS transistors having respective gates connected with the common data line pair.

6. A semiconductor memory apparatus described in accordance with the claim 1, wherein, the potential of the first bit line pair is amplified by the sense amplifier, and then the thus amplified data is transferred into a second bit line pair and further is amplified by the main amplifier.

7. A semiconductor memory apparatus comprising:
plural first bit lines connected directly with memory cells and adapted to read and write data,
a sense amplifier connected with a pair of said first bit lines,
plural second bit line pairs connected through first switch elements, which are equal in number to the first bit lines, with end portions of a pair or a plurality of pairs of said first bit lines,
a main amplifier connected with a second bit line pairs and adapted to be controlled by a column selecting signal,
a common data line pair connected through second switch elements, which are controlled by the column selecting signal, with end portions of a plurality of second bit line pairs,
each of said first switch elements being operable to select only a block including one or some of the memory cells then reading or writing the data while the remaining memory cells not reading or writing the data are held non-selected;
wherein the main amplifier is a differential amplifier composed of two N type MOS transistors having respective gates connected with the second bit line pair and respective sources both connected to a third N type MOS transistor, and two P type MOS transistors having respective gates connected with the second bit line pair and respective sources both connected to a power supply line, the gate of the third N type MOS transistor receiving the column selecting signal.

8. A semiconductor memory apparatus comprising:
plural first bit lines connected directly with memory cells and adapted to read and write data,
a sense amplifier connected with a pair of said first bit lines,
plural second bit line pairs connected through first switch elements, which are equal in number to the first bit lines, with end portions of a pair or a plurality of pairs of said first bit lines,
a main amplifier connected with a second bit line pairs and adapted to be controlled by a column selecting signal,
a common data line pair connected through second switch elements, which are controlled by the column selecting signal, with end portions of a plurality of second bit line pairs,
each of said first switch elements being operable to select only a block including one or some of the memory cells then reading or writing the data while the remaining memory cells not reading or writing the data are held non-selected;
wherein the main amplifier is a differential amplifier composed of two N type MOS transistors having respective gates connected with the second bit line pair and respective sources both connected with a third N type MOS transistor, and two P type MOS transistors having respective gates connected with the second bit line pair and respective sources both connected with a third P type MOS transistor, the gate of the third P type MOS transistor receiving an inverted column selecting signal, the gate of the third N type MOS transistor receiving the column selecting signal.

9. A semiconductor memory apparatus comprising:
plural first bit lines connected directly with memory cells and adapted to read and write data,
a sense amplifier connected with a pair of said first bit lines,
plural second bit line pairs connected through first switch elements, which are equal in number to the first bit lines, with end portions of a pair or a plurality of pairs of said first bit lines,
a main amplifier connected with a second bit line pairs and adapted to be controlled by a column selecting signal,
a common data line pair connected through second switch elements, which are controlled by the column selecting signal, with end portions of a plurality of second bit line pairs,
each of said first switch elements being operable to select only a block including one or some of the memory cells then reading or writing the data while the remaining memory cells not reading or writing the data are held non-selected;
wherein, the potential of the first bit line pair is amplified by the sense amplifier and, then the thus amplified data is transferred into the second bit line pair, said apparatus further including means for activating the column selecting signals to operate the main amplifier to amplify the potential of the second bit line pair at the same time or after the data is transferred into the second bit line pair or the common data line pair.

10. A semiconductor memory apparatus comprising:
plural first bit lines connected directly with memory cells and adapted to read and write data,
a sense amplifier connected with a pair of said first bit lines,
plural second bit line pairs connected through first switch elements, which are equal in number to the first bit lines and controlled by a logical element with a signal for selecting a block having the memory cell and a column selecting signal being inputted therein, with end portions of a pair or a plurality of pairs of said first bit lines,
a main amplifier connected with a second bit line pair,
a common data line pair connected through second switch elements, which are controlled with the column selecting signal, with end portions of a plurality of second bit line pairs,
each of said first switch elements being operable to select only a block including one or some of the memory cells then reading or writing the data while the remaining memory cells not reading or writing the data are held non-selected.

11. A semiconductor memory apparatus described in accordance with the claim 10, wherein each memory cell is composed of a switching transistor and a capacitor controlled by word lines.

12. A semiconductor memory apparatus described in accordance with the claim 10, wherein the sense amplifier is a differential amplifier composed of two N type MOS transistors having respective gates connected with the pair of first bit lines and two P type MOS transistors having respective gates connected with the pair of first bit lines.

13. A semiconductor memory apparatus described in accordance with the claim 10, wherein the sense amplifier is a differential amplifier composed of two N type MOS transistors having respective gates connected with the pair of first bit lines.

14. A semiconductor memory apparatus described in accordance with the claim 10, wherein the main amplifier is a differential amplifier composed of two N type MOS transistors having respective gates connected with the second bit line pair and two P type MOS transistors having respective gates connected with the second bit line pair.

15. A semiconductor memory apparatus described in accordance with the claim 10, wherein the potential of the first bit line pair is amplified by the sense amplifier, and then the column selecting signal is activated, the thus amplified data is transferred into the second bit line pair from the first bit line pair, the main amplifier is activated to amplify the data of the second bit line pair and at the same time the data is transferred into the common data line pair.

16. A semiconductor memory apparatus comprising:
plural first bit lines connected directly with memory cells and adapted to read and write data,
a sense amplifier connected with a pair of said plural first bit lines,
plural second bit line pairs connected through first switch elements, which are equal in number to the plural first bit lines and controlled by a signal for selecting a block having a one of the memory cells, and through second switch elements, which are connected in series with the first switch elements and controlled by a column selecting signal, with end portions of a pair or a plurality of pairs of said first bit lines,
a main amplifier connected with a second bit line pair,
a common data line pair connected through third switch elements, which are controlled by the column selecting signal, with end portions of a plurality the second bit line pairs,
each of said first switch elements being operable to select only a block including one or some of the memory cells then reading or writing the data while the remaining memory cells not reading or writing the data are held non-selected.

17. A semiconductor memory apparatus described in accordance with the claim 16, wherein each memory cell is composed of a switching transistor and a capacitor controlled by word lines.

18. A semiconductor memory apparatus described in accordance with the claim 16, wherein the sense amplifier is a differential amplifier composed of two N type MOS transistors having .respective gates connected with the pair of first bit lines and two P type MOS transistors having respective gates connected with the pair of first bit lines.

19. A semiconductor memory apparatus described in accordance with the claim 16, wherein the sense amplifier is a differential amplifier composed of two N type MOS transistors having respective gates connected with the pair of first bit lines.

20. A semiconductor memory apparatus described in accordance with the claim 16, wherein the main amplifier is a differential amplifier composed of two N type MOS transistors having respective gates connected with the second bit line pair and two P type MOS transistors having respective gates connected with the second bit line pair.

21. A semiconductor memory apparatus described in accordance with the claim 16, wherein the potential of the first bit line pair is amplified by the sense amplifier, and then the column selecting signal is activated, the thus amplified data is transferred into the second bit line pair from the first bit line pair, the main amplifier is activated to amplify the data of the second bit line pair and at the same time the data is transferred into the common data line pair.

* * * * *